United States Patent
Noguchi

(10) Patent No.: US 7,161,405 B2
(45) Date of Patent: Jan. 9, 2007

(54) LEVEL SHIFT CIRCUIT

(75) Inventor: Hidekazu Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/813,011

(22) Filed: Mar. 31, 2004

(65) Prior Publication Data

US 2005/0007175 A1  Jan. 13, 2005

(30) Foreign Application Priority Data

Jul. 11, 2003  (JP) ............................... 2003-195576

(51) Int. Cl.
*H03L 5/00* (2006.01)

(52) U.S. Cl. .................. 327/333; 327/306; 327/315; 326/60; 326/62; 326/80

(58) Field of Classification Search ............... None
See application file for complete search history.

(56) References Cited

U.S. PATENT DOCUMENTS

| | | | | |
|---|---|---|---|---|
| 4,667,310 A | * | 5/1987 | Takada | 365/154 |
| 5,264,738 A | * | 11/1993 | Veendrick et al. | 327/203 |
| 5,467,038 A | * | 11/1995 | Motley et al. | 327/185 |
| 6,084,454 A | * | 7/2000 | Holst | 327/198 |
| 6,144,241 A | * | 11/2000 | Wong | 327/202 |
| 6,188,260 B1 | * | 2/2001 | Stotz et al. | 327/202 |
| 6,549,465 B1 | * | 4/2003 | Hirano et al. | 365/185.23 |
| 2005/0121789 A1 | * | 6/2005 | Madurawe | 257/758 |

FOREIGN PATENT DOCUMENTS

| | | |
|---|---|---|
| JP | 05-055900 | 3/1993 |
| JP | 09-244585 | 9/1997 |
| JP | 10-084259 | 3/1998 |

* cited by examiner

*Primary Examiner*—Tuan T. Lam
*Assistant Examiner*—Hiep Nguyen
(74) *Attorney, Agent, or Firm*—Nixon Peabody LLP; Donald R. Studebaker

(57) ABSTRACT

A level shift circuit includes first and second inverters and an inversion circuit. The first inverter has a first input terminal and a first output terminal for generating the output signal. The first inverter includes a first transistor having a first current driving capacity. The second inverter has a second input terminal connected to the first output terminal and a second output terminal connected to the first input terminal. The second inverter includes a second transistor having a second current driving capacity smaller than the first capacity. The inversion circuit has an output terminal connected to the first input terminal. The inversion circuit receives an input signal including a first input signal and a second input signal one of which is a one-shot pulse signal. The inversion circuit includes a third transistor having a third current driving capacity smaller than the first capacity and larger than the second capacity.

18 Claims, 7 Drawing Sheets

LEVEL SHIFT CIRCUIT

BACKGROUND OF THE INVENTION

The present invention relates to a level shift circuit, and particularly to a level shift circuit that converts a signal having a first amplitude to a signal having a second amplitude.

With a recent demand for a reduction in power consumption, a power supply voltage used inside a semiconductor integrated circuit has been gradually reduced. On the other hand, however, there is a case in, which a semiconductor integrated circuit device operated at a high voltage is connected to the outside of a semiconductor integrated circuit operated at a low voltage. In such a case, there is a need to step up or boost a signal of the low voltage-operated semiconductor integrated circuit by a level shift circuit and supply the signal to the external semiconductor integrated circuit device.

The level shift circuit comprises, for example, a flip-flop driven by a high voltage VCC on the output side thereof and an inverting transistor driven by a low voltage VDD on the input side thereof and for inverting the state of the flip-flop. When the difference between VCC and VDD is large where the state of the flip-flop is pulled down from the power supply level VCC to a ground level VSS by the inverting transistor in such a level shift circuit, the force of trying to pull up the state to VCC by the flip-flop becomes strong and the force of trying to pull down it to VSS by the inverting transistor in reverse become weak, so that the state cannot be inverted. Such conditions are apt to take place as the difference between VCC and VDD becomes large, and is prone to occur even when VDD is close to the threshold voltage of the inverting transistor.

In order to prevent such conditions, there is a need to enlarge a gate width of the inverting transistor. Since, however, a current driving capacity of a transistor of the flip-flop looks larger than that of the inverting transistor where the difference between VCC and VDD is large, there is a need to drastically enlarge the gate width of the inverting transistor in order to overcome such a current driving capacity. With the increase in the gate width of the inverting transistor, there is further a need to scale up even a driver circuit for driving the inverting transistor. Thus, there is a fear that a circuit area will greatly increase.

As conventional level shift circuits, there are known those described in, for example, patent documents 1 through 3 shown below. The level shift circuit described in the patent document 1 is configured such that CMOS transistors are two-stage connected in cascade, and a ground level of the CMOS transistor corresponding to the first stage is set to a negative voltage to reduce its threshold voltage, thereby making it possible to invert the CMOS transistor corresponding to the second stage at high speed. The patent document 2 describes a level shift circuit with a state holding function. The present level shift circuit is configured in such a manner that in a flip-flop circuit in which CMOS transistors are connected in ring form, two input signals are respectively inputted from the power supply sides of respective inverters and an output signal is fetched from a connecting portion of the CMOS transistors provided on the side opposite to the CMOS transistors respectively inputted with the input signals. Further, a current driving capacity of the transistor on the ground side in the respective CMOS transistors is set sufficiently smaller than that of the transistor thereof on the power supply side to thereby reduce consumption of a DC current with a level shift. The patent document 3 describes a level shift circuit with a state holding function. The present level shift circuit is configured such that inverters comprised of CMOS transistors are two-stage connected in cascade and a latch transistor driven by a clock signal is inserted at the CMOS transistor corresponding-to the second stage to latch the output of the corresponding inverter.

Japanese Patent Application Laid-Open No. Hei 10(1998)-84259 (3rd to 6th pages and FIGS. 1 and 3).

Japanese Patent Application Laid-Open No. Hei 5(1993)-55900 (2nd to 3rd pages and FIGS. 1 and 6)

Japanese Patent Application Laid-Open No. Hei 9(1997)-244585 (3rd to 12th pages and FIG. 1)

The level shift circuit described in the patent document 1 has the fear that a power supply circuit for generating the negative voltage of the ground level of the CMOS transistor corresponding to the first stage is extra required, thus causing scale-up of a circuit area. Also the patent document 1 does not describe the level shift circuit with the state holding function.

The level shift circuit described in the patent document 2 has the fear that while the consumption of the DC current can be suppressed because the current driving capacity of the transistor on the ground side is set sufficiently smaller than the current driving capacity of the transistor on the power supply side, the time required to invert an output state to an L level becomes long, thereby interfering with its speeding-up. The patent document 2 does not describe a reduction in circuit area where the difference between the voltage on the input side and the voltage on the output side becomes large.

The level shift circuit described in the patent document 3 has the fear that there is a need to input the clock signal in order to latch the output state, and a wiring for input of the clock signal is extra needed, thereby scaling up a circuit area.

SUMMARY OF THE INVENTION

The present invention may suppress an increase in circuit area even when a power supply voltage on the input side is greatly lower than a power supply voltage on the output side in a level shift circuit.

The preset invention provides a level shift circuit for amplifying a signal having a first amplitude to a signal having a second amplitude. The level shift circuit comprises a first inverter, a second inverter and an inversion circuit. The first inverter consists of transistors having a first current driving capacity and outputs an output signal having a second amplitude. The second inverter consists of transistors having a second current driving capacity smaller than the first current driving capacity. The input side of the second inverter is connected to the output side of the first inverter and the output side thereof is connected to the input side of the first inverter. The inversion circuit consists of transistors having a third current driving capacity smaller than the first current driving capacity and larger than the second driving capacity. The inversion circuit is inputted with first and second input signals each having a first amplitude, of which at least one is a one-shot pulse signal, thereby driving the first inverter.

In the level shift circuit, a drive signal is outputted from the inversion circuit based on the first and second input signals each having the first amplitude. The drive signal is supplied to the input side of the first inverter, and an output signal having a second amplitude, which is obtained by inverting the drive signal, is outputted from the first inverter.

Then, the output signal is inverted by the second inverter and a signal identical in level to the drive signal is supplied to the input side of the first inverter, whereby the state of the first inverter is held by the second inverter. Since the second inverter may simply retain the state of the output signal, a current driving capacity of the second inverter may be very small (second current driving capacity) as compared with the case in which the first inverter for driving a load on the output side needs a large current driving capacity (first current driving capacity). Therefore, in order to invert the state on the output side of the second inverter holding the output state, a so-large current driving capacity is not required and a current driving capacity (third current driving capacity) larger than the second current driving capacity but considerably smaller than the first current driving capacity may be set. Thus, the current driving capacity of the inversion circuit can be substantially reduced as compared with the case in which the state of the output signal of the first inverter large in current driving capacity is directly inverted. Consequently, even when the power supply voltage on the input side is substantially lower than the power supply voltage on the output side, the enlargement of a gate width of each of the transistors constituting the inversion circuit is suppressed to the minimum to control or suppress expansion of a circuit area, and in this condition the state of the level shift circuit can be suitably inverted.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
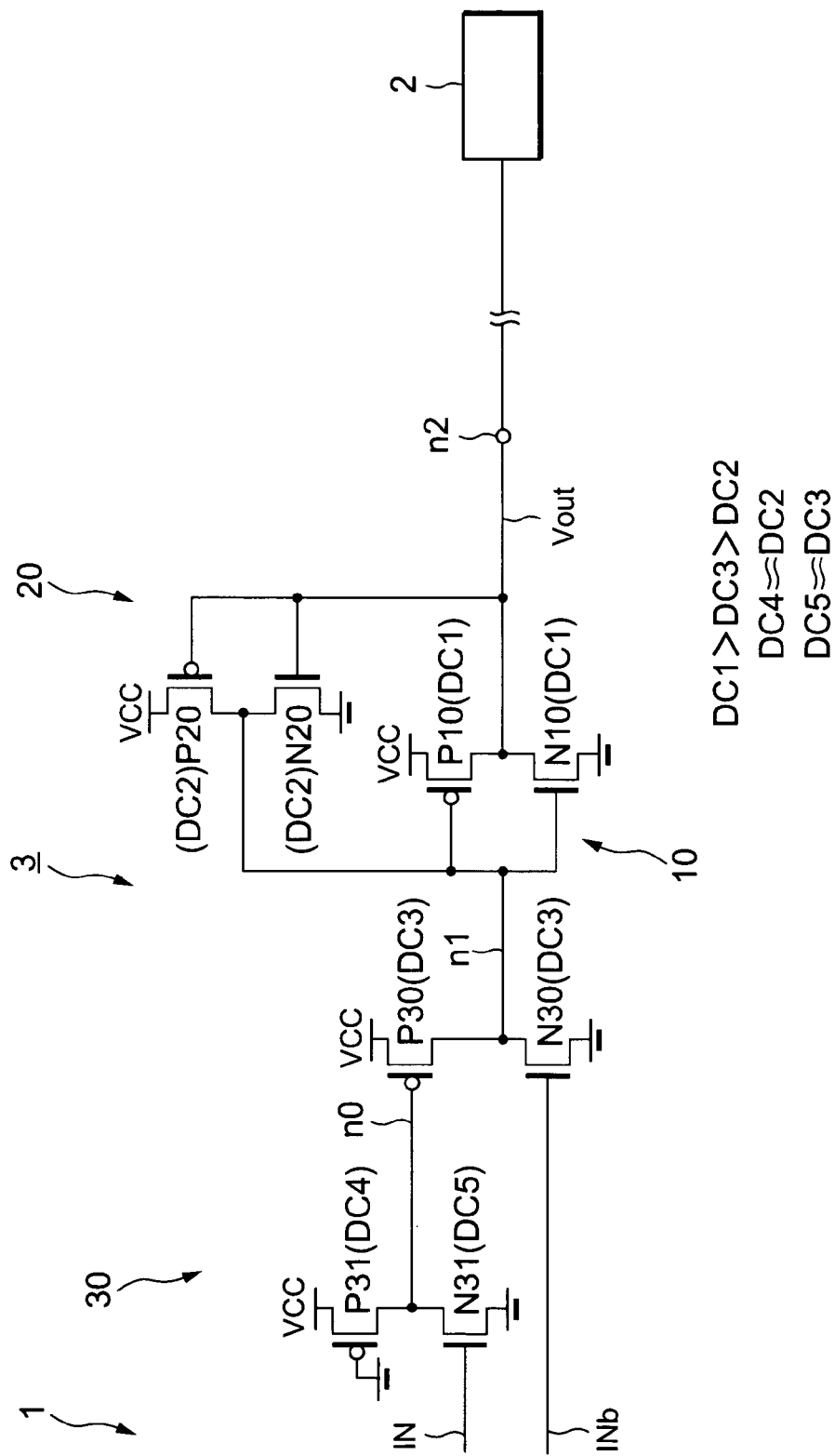
FIG. 1 is an electric circuit diagram showing a level shift circuit according to a first embodiment of the present invention.

FIG. 1 is an electric circuit diagram showing a level shift circuit 3 according to a first embodiment of the present invention. The level shift circuit 3 is used in an interface circuit which amplifies, i.e., boosts a signal at a semiconductor integrated circuit 1 driven by amplitude of a power supply level VDD minus a ground level VSS and outputs the boosted signal to a semiconductor integrated circuit 2 driven by a power supply level VCC minus the ground level VSS. Although a description is made here of an example in which the semiconductor integrated circuit 1 is provided with the level shift circuit 3, the semiconductor integrated circuit 2 may be provided with the level shift circuit 3.

As shown in FIG. 1, the level shift circuit 3 comprises an output inverter 10 that outputs an output signal Vout to the semiconductor integrated circuit 2, a state holding inverter 20 that holds a state of the output signal Vout of the inverter 10, and an inversion circuit 30 for driving the inverter 10.

The inverter 10 consists of a CMOS transistor comprising a pch transistor P10 and an nch transistor N10 both series-connected to each other. The transistors P10 and N10 are respectively formed to such a gate width as to have a first current driving capacity DC1. A drain terminal of the transistor P10 is connected to the power supply voltage (power supply level) VCC of the semiconductor integrated circuit 2, and a source terminal of the transistor N10 is connected to the ground level VSS. A source terminal of the transistor P10 and a drain terminal of the transistor N10 are connected to each other, and the output signal Vout is outputted from a portion where their terminals are connected to each other. A drive signal is inputted from the inversion circuit 30 to gate terminals of the transistors P10 and N10. For convenience of illustration in the present embodiment, a node to which the drive signal is inputted, is defined as a node n1 and a node from which the output signal Vout is outputted, is defined as a node n2.

The inverter 20 is made up of a CMOS transistor comprising a pch transistor P20 and an nch transistor N20 both series-connected to each other. The transistors P20 and N20 are respectively formed to such a gate width as to have a second current driving capacity DC2 smaller than the first current driving capacity DC1. A drain terminal of the transistor P20 is connected to the power supply level VCC of the semiconductor integrated circuit 2, and a source terminal of the transistor N20 is connected to the ground level VSS. Gate terminals of the transistors P20 and N20 are respectively connected to the node n2 corresponding to the output part or section of the inverter 10. A portion where the source terminal of the transistor P20 and the drain terminal of the transistor N20 are connected to each other, is connected to the node n1 corresponding to the input side of the inverter 10.

The inversion circuit 30 outputs a drive signal for driving the inverter 10, based on the input of input signals IN and INb produced by the power supply level VDD of the semiconductor integrated circuit 1. The inversion circuit 30 comprises a CMOS transistor made up of a pch transistor P30 and an nch transistor N30 both series-connected to each other, and a CMOS transistor made up of a pch transistor P31 and an nch transistor N31 both series-connected to each other. Each of the transistors P30 and N30 has a gate width formed so that it has a third current driving capacity DC3 smaller than the first current driving capacity DC1 and larger than the second current driving capacity DC2. Further, the transistor P31 has a gate width formed so that it has a fourth current driving capacity DC4 substantially identical (nearly equal) to the second current driving capacity DC2. The transistor N31 has a gate width formed such that it has a fifth current driving capacity DC5 substantially identical (nearly equal) to the third current driving capacity.

A drain terminal of the transistor P30 is connected to the power supply level VCC of the semiconductor integrated circuit 2, and a source terminal of the transistor N30 is connected to the ground level VSS. A portion where the source terminal of the transistor P30 and the drain terminal of the transistor N30 are connected to each other, is connected to the node n1 corresponding to the input side of the inverter 10. A drain terminal of the transistor P31 is connected to the power supply level VCC of the semiconductor integrated circuit 2, and a source terminal of the transistor N31 is connected to the ground level VSS. A source terminal of the transistor P31 and a drain terminal of the transistor N31 are connected to each other and connected to a gate terminal of the transistor P30. A node to which the source terminal of the transistor P31, the drain terminal of the transistor N31 and the gate terminal of the transistor P30 are connected, is defined as a node n0 here.

Figure 2:
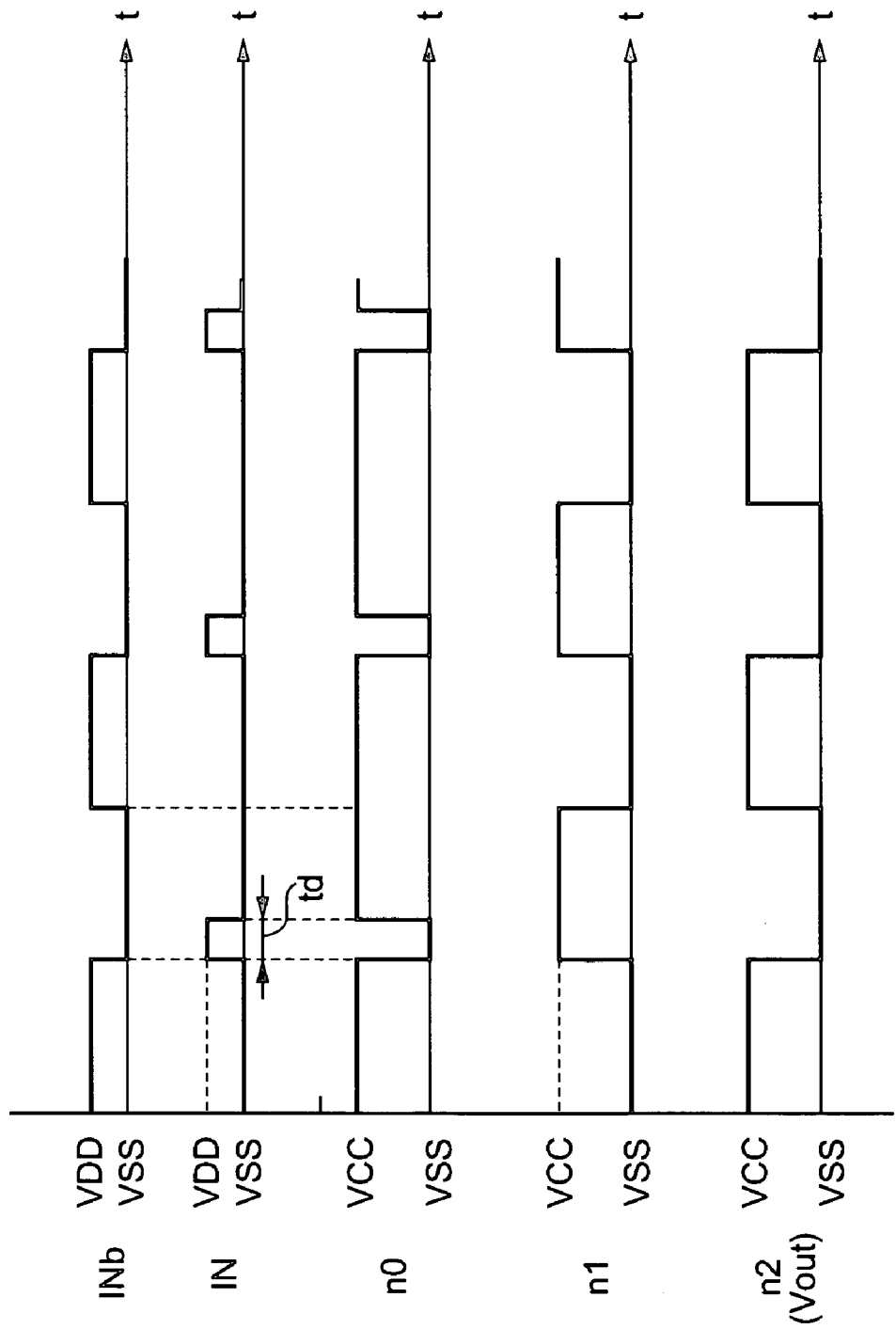
FIG. 2 illustrates signal waveforms of respective sections, for describing the operation of the level shift circuit shown in FIG. 1.

A gate terminal of the transistor P31 is connected to ground and normally held in conduction. The input signal IN is inputted to a gate terminal of the transistor N31. Here, the input signal IN is a one-shot pulse signal whose pulse width is defined as td, as shown in FIG. 2. The transistors P31 and N31 invert the state of the node n0 to the power supply level VCC or ground level VSS, based on the input signal IN. Also the transistors P30 and N30 invert the state of the node n1 to the power supply level VCC or ground level VSS, based on the state of the node n0 determined depending on the input signal IN and the input signal INb.

Now assume that the first current driving capacity DC1 is DC1=100 for comparison between the current driving capacities of the respective transistors. Since the inverter 20 may simply hold the state of the output of the inverter 10, the second current driving capacity DC2 of the transistors P20 and N20 is DC2=1 to 2 equivalent to one-hundredth to one-fiftieth of the DC1. The third current driving capacity DC3 of the transistors P30 and N30 for inverting the state of the node n1, which is held by the transistor P30 or N20, needs about five to ten times the DC2 and is given as DC2=5 to 20. The fourth and fifth current driving capacities are respectively DC4=about 1 to 2 and DC5=about 5 to 20.

FIG. 2 illustrates signal waveforms of respective sections, for explaining the operation of the level shift circuit 3.

First of all, when INb is VDD and IN is VSS, the transistor N31 is held in non-conduction and the node n0 is held at VCC by the normally-conducting transistor P31. Since the node n0 is VCC and INb is VDD, the transistor P30 is held in non-conduction, the transistor N30 is held in conduction and the node n1 is short-circuited to VSS. Accordingly, the node n1 is VSS and the transistor P10 is brought into conduction, so that an output signal Vout=VCC is outputted to the node n2. VCC is inputted to the gate terminals of the transistors P20 and N20 of the inverter 20 to bring the transistor N20 into conduction, so that the node n1 is held at VSS.

Next, when INb is inverted from VDD to VSS and IN is inverted from VSS to VDD, the transistor N31 is brought into conduction so that the node n0 is short-circuited to VSS. Since the fourth current driving capacity DC4 of the transistor P31 is sufficiently smaller than the fifth current driving capacity DC5 of the transistor N31 here, the transistor N31 overcomes the current driving capacity of the transistor P31 so that the none n0 is inverted from VCC to VSS. When the node n0 is inverted to VSS, the transistor P30 is brought into conduction and at the same time the transistor N30 is held in non-conduction. Therefore, the node n1 is inverted from VSS to VCC. Since, at this time, the third current driving capacity DC3 of the transistor P30 is sufficiently larger than the second current driving capacity DC2 of the transistor N20, the transistor P30 overcomes the current driving capacity of the transistor N20 so that the node n1 is inverted from VSS to VCC. When the node n1 is inverted to VCC, the transistor N10 is brought into conduction so that an output signal Vout=VSS is outputted to the node n2. Also the transistor P20 of the inverter 20 is brought into conduction to hold the node n1 at VCC.

When IN reaches VSS after having reached VDD during a time td, the transistor N31 is brought into non-conduction so that the node n0 is inverted to VCC, thereby bringing the transistor P30 into non-conduction. At this time, INb still remains at VSS and the transistor N30 is also in a non-conducting state. Thus, while the node n1 is disconnected from both the power supply level VCC and the ground level VSS, it is held at VCC through the transistor P20. Therefore, the node n1 is kept in a VCC state to cause the transistor N10 to continuously conduct, thereby allowing the state of the output signal Vout=VSS to be held.

Next, when INb is inverted to VDD, the transistor N30 conducts. On the other hand, since IN continues in the state of VSS, the transistor P30 still remains nonconductive, so the node n1 is inverted from VCC to VSS. Although the node n1 is supplied with VCC through the transistor P20 at this time, the third current driving capacity DC3 of the transistor N30 is sufficiently larger than the second current driving capacity DC2 of the transistor P20. Therefore, the state of the node n1 is inverted to VSS. When the node n1 is inverted to VSS, the transistor P10 is brought into conduction so that an output signal Vout=VCC is outputted to the node n2.

Since the output state of the output inverter 10 is held by the state holding inverter 20 in the level shift circuit 3 of the present embodiment as described above, the current driving capacity DC2 of the transistors P20 and N20 can be extremely reduced to 1/100 to 1/50 the current driving capacity DC1 of the transistors P1 and N10, and the current driving capacity DC3 of the transistors P30 and N30 of the inversion circuit 30 that inverts the state held in the extremely small current driving capacity DC2 can also be reduced. Accordingly, the transistors P30 and N30 can be reduced in gate width. Since the transistor N31 that inverts the state of the transistor P30 may take a current driving capacity nearly equal to the above, the gate width of the transistor N31 can also be reduced. Accordingly, even when the power supply level VDD of the semiconductor integrated circuit 1 is drastically low as compared with the power supply level VCC of the semiconductor integrated circuit 2, the state of the level shift circuit 3 can be suitably inverted while an increase in circuit area is being suppressed to the minimum.

Figure 3:
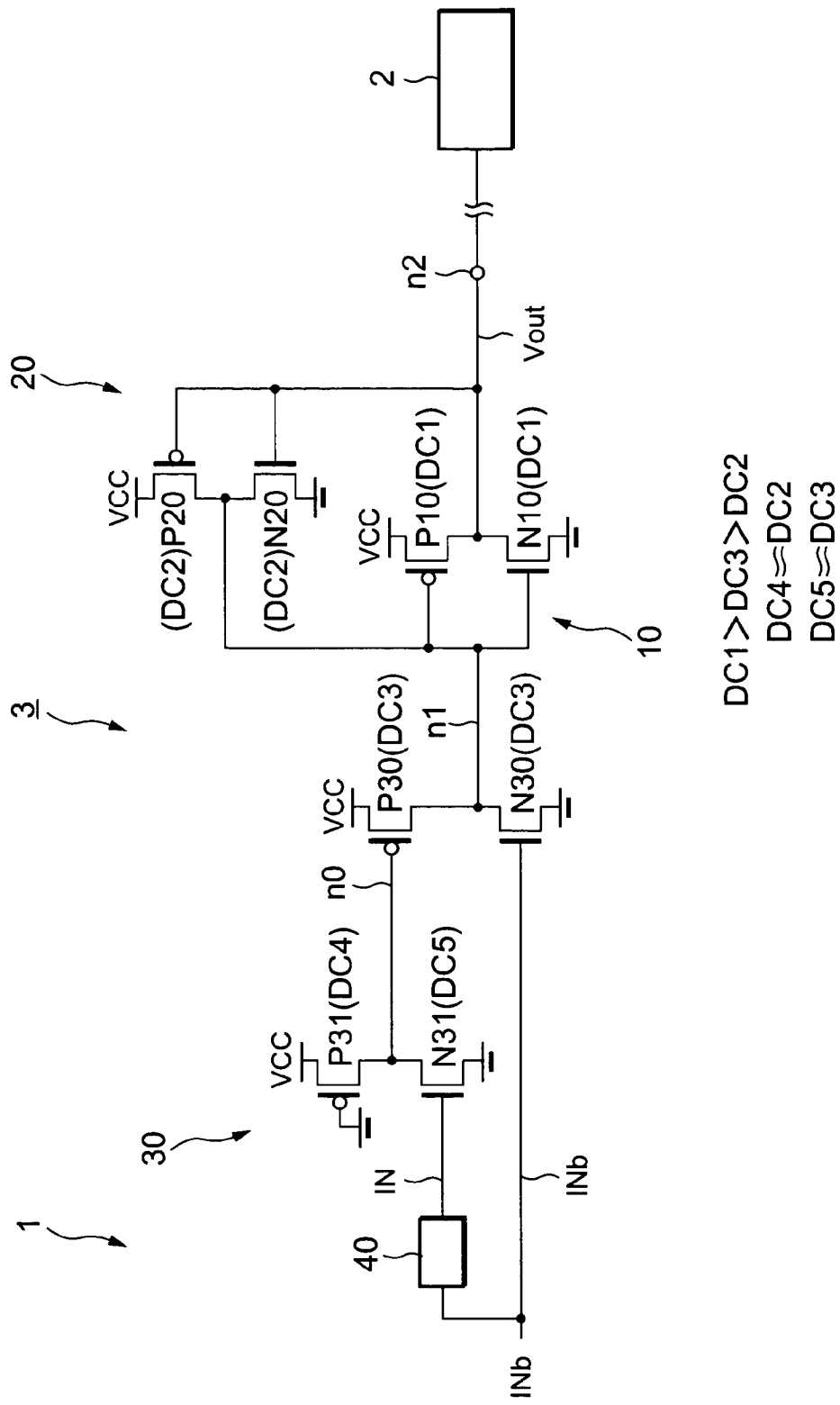
FIG. 3 is an electric circuit diagram depicting a level shift circuit according to a second embodiment of the present invention.

FIG. 3 is an electric circuit diagram showing a level shift circuit 3 according to a second embodiment of the present invention.

The level shift circuit 3 according to the present embodiment is provided with a one-shot pulse generator 40 for generating an input signal IN corresponding to a one-shot pulse signal, based on an input signal INb, and inputs the input signal IN generated by the one-shot pulse generator 40 to an inversion circuit 30.

Figure 4:
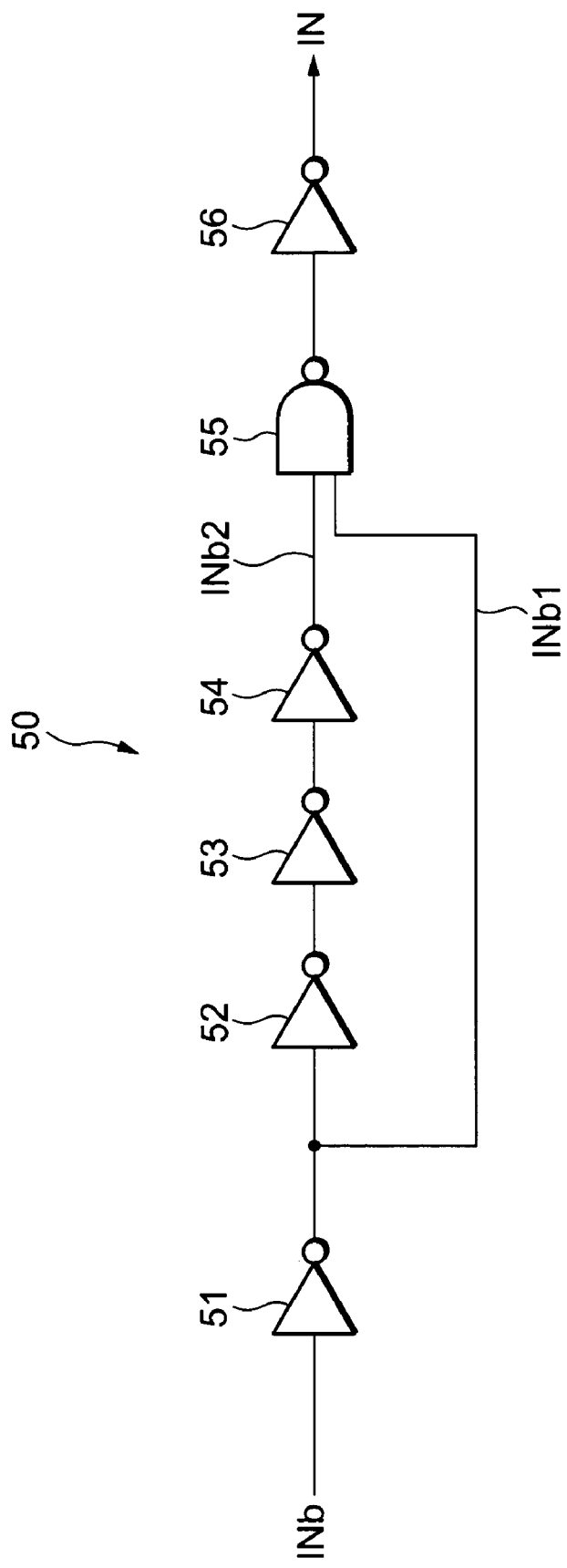
FIG. 4 is an electric circuit diagram showing a one-shot pulse generator.

FIG. 4 is an electric circuit diagram of the one-shot pulse generator 40. The one-shot pulse generator 40 comprises an inverter 51 that inverts the input signal INb to a signal INb1, inverters 52 through 54 used as delay circuits that delay and invert the signal INb1 to thereby produce a signal INb2, a NAND circuit 55 that calculates the NAND of the signals INb1 and INb2, and an inverter 56 that inverts the calculated NAND signal to generate an input signal IN. These inverters 51 through 54, the NAND circuit 55 and the inverter 56 are operated at a power supply level VDD.

Figure 5:
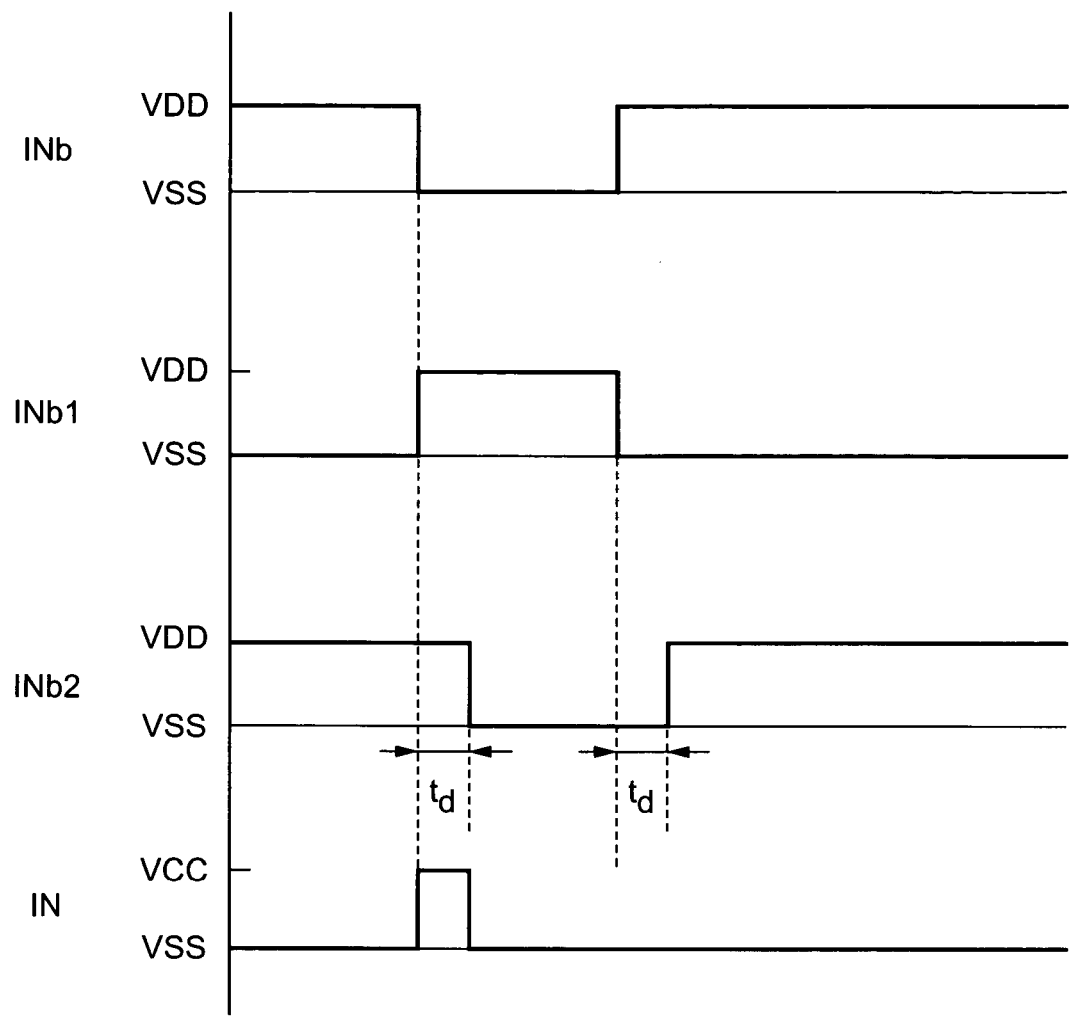
FIG. 5 illustrates signal waveforms of respective parts, for explaining the operation of the one-shot pulse generator.

FIG. 5 illustrates signal waveforms of respective sections, for describing the operation of the one-shot pulse generator 40. When the input signal INb is inverted from VDD to VSS, the signal INb1 is inverted from VSS to VDD. However, the signal INb2 is delayed in its inversion only during a delay time td by the inverters 52 through 54 and held at VDD. Thus, both INb1 and INb2 reach VDD during the delay time td and the signal IN results in VDD. When the signal INb2 is inverted to VSS after the elapse of the delay time td, the signal IN is returned to VSS again. The input signal IN used as the one-shot pulse signal is generated in this way. Incidentally, when the signal INb is inverted from VSS to VDD, the signal INb1 is inverted from VDD to VSS and the signal INb2 is held at VSS during the delay time td. However, the output of the NAND circuit 55 remains unchanged and the signal IN is not inverted from VSS to VDD. Thus, the one-shot pulse generator 40 generates a one-shot pulse signal whose pulse width is td, only when the signal INb is inverted from VDD to VSS.

In the present embodiment, the level shift circuit 3 can be configured so as to output an output signal Vout, based on the input of the input signal INb by addition of the one-shot pulse generator 40 simple in structure. It is possible to allow the level shift circuit 3 to carry out an operation similar to a level shift circuit free of a state holding function.

Figure 6:
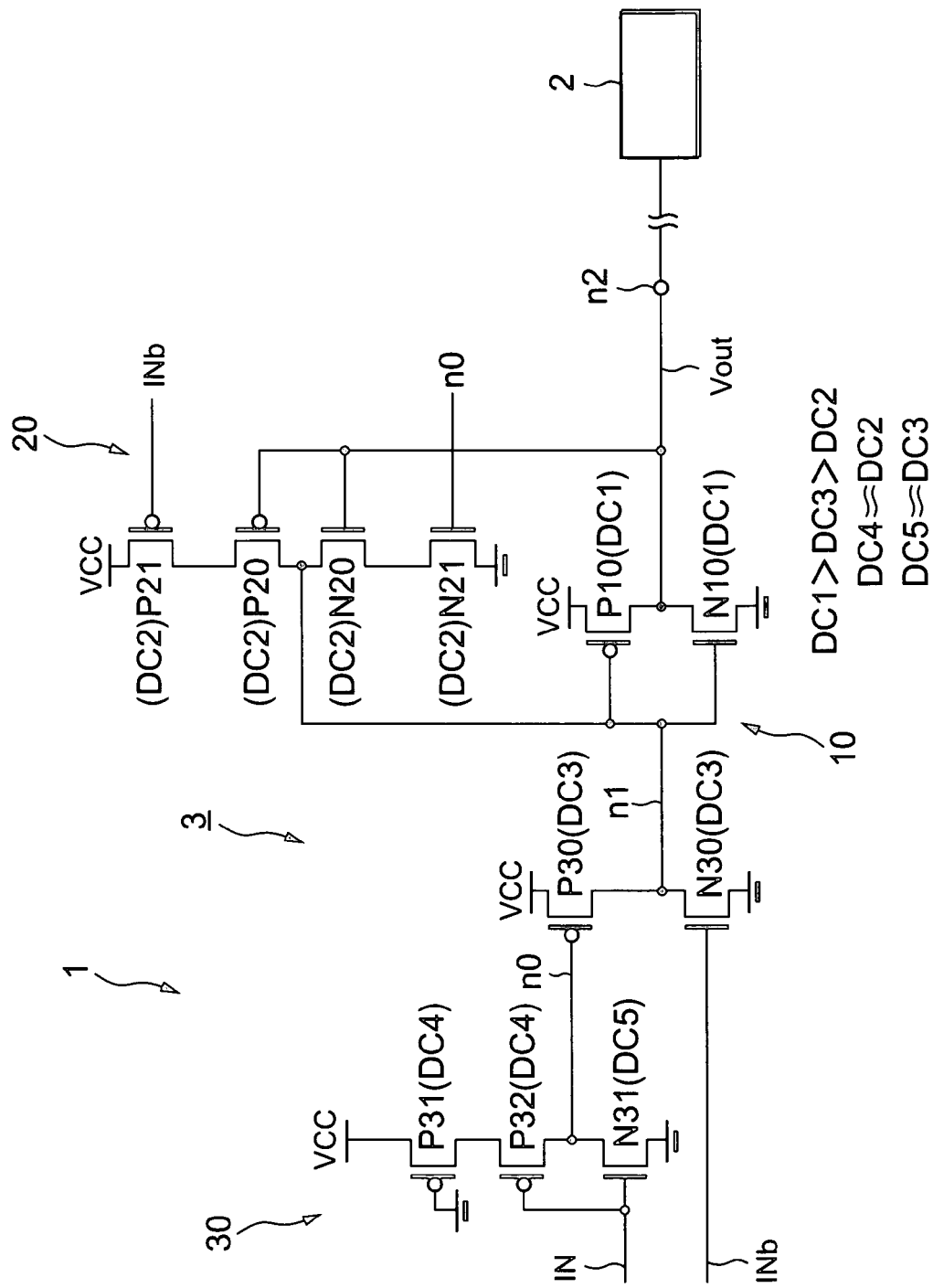
FIG. 6 is an electric circuit diagram showing a level shift circuit according to a third embodiment of the present invention.

FIG. 6 is an electric circuit diagram illustrating a level shift circuit 3 according to a third embodiment of the present invention. Elements of structure similar to those employed in the semiconductor integrated circuit 1 according to the first embodiment are respectively identified by the same reference numerals, and their description will be omitted. In the present embodiment, the level shift circuit 3 according to the first embodiment is added with transistors P32, P21 and N21.

The transistor P32 is inserted between the transistor P31 and the transistor N31 in the inversion circuit 30, in more detail, between the transistor P31 and the node n0 and has a gate terminal inputted with an input signal IN. Incidentally, the transistor P32 may be inserted between the power supply level VCC and the transistor P31. The transistor P32 has a gate width formed so that it has a current driving capacity substantially identical (nearly equal) to the current driving capacity DC4 of the transistor P31. When an input signal INb is inverted from VDD to VSS and the input signal IN is inverted from VSS to VDD upon the operation of the level shift circuit 3, the transistor N31 is brought into conduction. Since, at this time, the transistor P32 is narrower than the transistor N31 in gate width and a gate-to-source voltage thereof exceeds a threshold voltage thereof, a predetermined resistance value is produced or formed between the source and drain thereof even though the transistor P32 is not perfectly cut off at VDD (<VCC). Thus, it is possible to substantially attenuate or weaken the force of pulling up the state of the node n0 to VCC by the transistor P31 and cause the transistor N31 to quickly invert the state of the node n0 from VCC to VSS. When the transistor N31 is brought to a conducting state, the resistance value of the transistor P32 makes it possible to restrict a through current that flows from the power supply level VCC to the ground level VSS through the transistor P31 and the transistor N31.

The transistor P21 is inserted between the power supply level VCC and the transistor P20 in the inverter 20 and has a gate terminal inputted with the input signal INb. Incidentally, the transistor P21 may be inserted between the transistor P20 and the node n1. The transistor N21 is inserted between the ground level VSS and the transistor N20 in the inverter 20 and has a gate terminal electrically connected to the node n0. Incidentally, the transistor N21 may be inserted between the transistor N20 and the node n1. Each of the transistors P21 and N21 has a gate width formed so that it has a current driving capacity substantially identical (nearly equal) to the current driving capacity DC2 of the transistors P20 and N20.

When the input signal INb is inverted from VSS to VDD upon the operation of the level shift circuit 3, the transistor N30 conducts. While the transistor P21 is not perfectly cut off at VDD (<VCC) because a gate-to-source voltage thereof exceeds a threshold voltage thereof at this time, a predetermined resistance value is generated or formed between the source and drain thereof. Thus, it is possible to substantially attenuate or weaken the force of pulling up the state of the node n1 to VCC by the transistor P20 and cause the transistor N30 to quickly invert the state of the node n1 from VCC to VSS. When the transistor N20 is brought to a conducting state, the resistance value of the transistor P21 makes it possible to restrict a through current that flows from the power supply level VCC to the ground level VSS through the transistors P20 and N20.

On the other hand, when the input signal INb is inverted from VDD to VSS, the transistor P30 conducts. At this time, the node n0 becomes VSS so that the transistor N21 is brought into non-conduction. Thus, it is possible to stop the force of pulling down the state of the node n1 to VSS by the transistor N20 and allow the transistor P30 to quickly invert the state of the node n1 from VSS to VCC. Since the transistor N21 is in a non-conducting state when the transistor P20 is brought into conduction, a through current that flows from the power supply level VCC to the ground level VSS through the transistors P20 and N20 can be limited.

Incidentally, while the transistors P32, P21 and N21 have been added to the previous level shift circuit in the present embodiment, any of above effects is obtained even if any one or two of these are added thereto. When, for example, only the transistor P32 is added, it is possible to make it easy to invert the state of the node n0 from VCC to VSS, and to reduce a through current. If at least one transistor P21 or N21 is added, it is then possible to make it easy to invert the state of the node n1 from VCC to VSS or VSS to VCC, and to reduce a through current.

Figure 7:
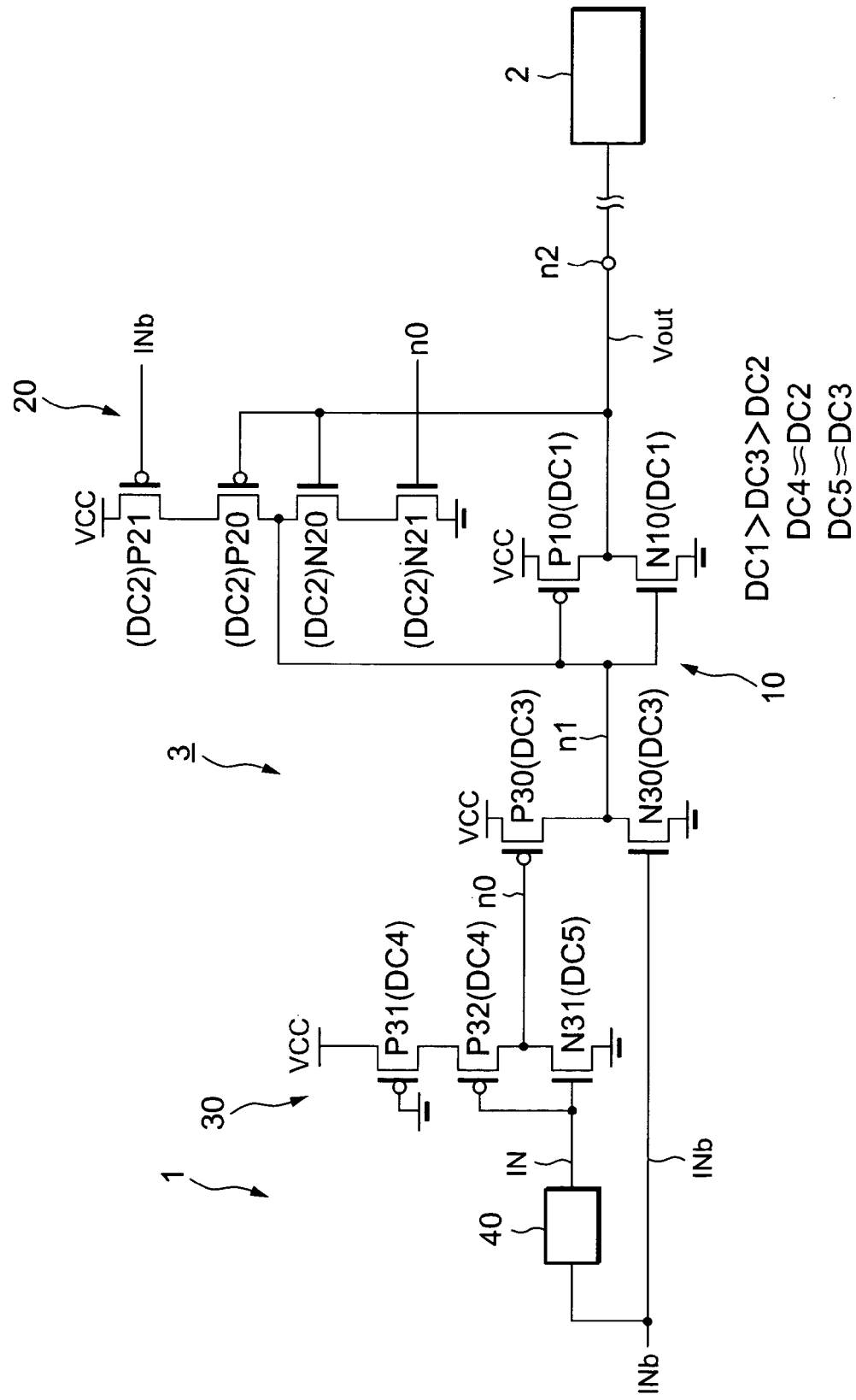
FIG. 7 is an electric circuit diagram illustrating a level shift circuit according to a fourth embodiment of the present invention.

FIG. 7 is an electric circuit diagram showing a level shift circuit according to a fourth embodiment of the present invention. In the present embodiment, the level shift circuit according to the third embodiment is provided with a one-shot pulse generator 40 illustrated in the second embodiment and inputs an input signal IN generated by the one-shot pulse generator 40 based on the input signal INb to the inversion circuit 30. According to the present embodiment, the operation and effect described in the second embodiment are brought about in addition to the operation and effect described in the third embodiment.

According to the present invention, an output inverter and a state holding inverter are separately provided to reduce a current driving capacity of the state holding inverter, and an inversion circuit is configured so as to invert a state held by the state holding inverter. It is therefore possible to drastically reduce a current driving capacity of the inversion circuit. Consequently, even when a power supply level on the input side is substantially low as compared with a power supply level on the output side, the expansion of a gate width of each transistor that constitutes the inversion circuit can be suppressed to the minimum and hence the scaling up of a circuit area can be restrained.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A level shift circuit for amplifying an input signal having a first amplitude to an output signal having a second amplitude, comprising:
 a first inverter having a first input terminal and a generating the output signal, the first inverter including a first transistor having a first current driving capacity;
 a second inverter having a second input terminal connected to the first output terminal and a second output terminal connected to the first input terminal, the second inverter including a second transistor having a second current driving capacity that is smaller than the first current driving capacity; and
 an inversion circuit having a third output terminal connected to the first input terminal, the inversion circuit receiving the input signal including a first input signal and a second input signal, the inversion circuit including a third transistor having a third current driving capacity that is smaller than the first current driving capacity and is larger than the second driving capacity,
 wherein one of the first and second input signals is a one-shot pulse signal.

2. A level shift circuit according to claim 1, wherein the first inverter includes a first NMOS transistor and a first PMOS transistor connected in series and the second inverter includes a second NMOS transistor and a second PMOS transistor connected in series,
 wherein gate terminals of the first NMOS and PMOS transistors are connected to the second and third output terminals, and
 wherein the first output terminal is connected to gate terminals of the second NMOS and PMOS transistors.

3. A level shift circuit according to claim 1, wherein the inversion circuit has a third NMOS transistor and a third PMOS transistor connected in series.

4. A level shift circuit according to claim 3, wherein the first input signal is the one-shot pulse signal.

5. A level shift circuit according to claim 4, wherein the inversion circuit further includes a fourth transistor having a fourth current driving capacity that is substantially identical to the second current driving capacity, the fourth transistor being normally conductive,
 and an fifth transistor connected in series with the fourth transistor, the fifth transistor having a fifth current driving capacity that is substantially identical to the third current driving, capacity, the fifth transistor receiving the first input signal, and
 wherein the third PMOS transistor is driven by a signal outputted from a connecting portion of the fourth and fifth transistors.

6. A level shift circuit according to claim 3, wherein said inversion circuit further includes a transistor which has a current driving capacity substantially identical to the second current driving capacity.

7. A level shift circuit according to claim 1, further comprising a one-shot pulse generator for generating the one-shot pulse signal in response to the second input signal.

8. A level shift circuit according to claim 7, wherein the one-shot pulse generator generates a one-shot pulse signal in response to a delay signal generated from the second input signal.

9. A semiconductor integrated circuit amplifying an input signal having a first amplitude to an output signal having a second amplitude, the semiconductor integrated circuit comprising:
 a first inverter having a first input terminal and a first output terminal for generating the output signal, the first inverter including a plurality of first transistors each having a first current driving capacity;
 a second inverter having a second input terminal connected to the first output terminal and a second output terminal connected to the first input terminal, the second inverter including a plurality of second transistors each having a second current driving capacity that is smaller than the first current driving capacity; and
 an inversion circuit including a plurality of third transistors each having a third current driving capacity that is smaller than the first current driving capacity and is larger than the second driving capacity, the inversion circuit driving the first inverter in response to the input signal, wherein the input signal includes a first input signal and a second input signal one of which is a one-shot pulse signal.

10. A level shift circuit according to claim 9, wherein the first transistors include a first NMOS transistor and a first PMOS transistor connected in series and the second transistors include a second NMOS transistor and a second PMOS transistor connected in series, wherein gate terminals of the first NMOS and PMOS transistors are connected to the second output terminal and an output terminal of the inversion circuit, and wherein the first output terminal is connected to gate terminals of the second NMOS and PMOS transistors.

11. A level shift circuit according to claim 9, wherein the third transistors include a third NMOS transistor and a third PMOS transistor connected in series.

12. A Level shift circuit according to claim 11, herein the first input signal is the one-shot pulse signal.

13. A level shift circuit according to claim 12, wherein the inversion circuit further includes a fourth transistor having a fourth current driving capacity that is substantially identical to the second current driving capacity, the fourth transistor being normally conductive, and an fifth transistor connected in series with the fourth transistor, the fifth transistor having a fifth current driving capacity that is substantially identical to the third current driving capacity, the fifth transistor receiving the first input signal, and wherein the third PMOS transistor is driven by a signal outputted from a connecting portion of the fourth and fifth transistors.

14. A level shift circuit according to claim 11, wherein said inversion circuit further includes a transistor which has a current driving capacity substantially identical to the second current driving capacity.

15. A level shift circuit according to claim 9, further comprising a one-shot pulse generator for generating the one-shot pulse signal in response to the second input signal.

16. A level shift circuit according to claim 15, wherein the one-shot pulse generator generates a one-shot pulse signal in response to a delay signal generated from the second input signal.

17. A level shift circuit comprising:
 a first inverter having a first input terminal and a first output terminal for generating an output signal having a first amplitude, the first inverter including a first transistor having a first current driving capacity; a second inverter having a second input terminal connected to the first output terminal a second output terminal connected to the first input terminal, the second inverter including a second transistor having a second current driving capacity that is smaller than the first current driving capacity; and an inversion circuit having a third output terminal connected to the first input terminal, the inversion circuit receiving an input signal having a second amplitude that is smaller than the first amplitude, the input signal including a first input signal and a second input signal, the inversion circuit including a third transistor having a third current driving capacity that is smaller than the first current driving capacity and is larger than the second driving capacity.

18. A level shift circuit according to claim 17, wherein one of the first and second input signals is a one-shot pulse signal.

* * * * *